United States Patent
Aleksov et al.

(10) Patent No.: US 12,165,994 B2
(45) Date of Patent: Dec. 10, 2024

(54) RADIO FREQUENCY ANTENNAS AND WAVEGUIDES FOR COMMUNICATION BETWEEN INTEGRATED CIRCUIT DEVICES

(71) Applicant: Intel Corporation, Santa Clara, CA (US)

(72) Inventors: Aleksandar Aleksov, Chandler, AZ (US); Kristof Darmawikarta, Chandler, AZ (US); Benjamin Duong, Phoenix, AZ (US); Telesphor Kamgaing, Chandler, AZ (US); Miranda Ngan, Chandler, AZ (US); Srinivas Pietambaram, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 935 days.

(21) Appl. No.: 17/024,307

(22) Filed: Sep. 17, 2020

(65) Prior Publication Data
US 2022/0084962 A1  Mar. 17, 2022

(51) Int. Cl.
| H01L 25/065 | (2023.01) |
| H01L 23/66 | (2006.01) |
| H01L 25/00 | (2006.01) |
| H01P 3/08 | (2006.01) |
| H01Q 1/22 | (2006.01) |
| H05K 1/02 | (2006.01) |

(52) U.S. Cl.
CPC .......... H01L 23/66 (2013.01); H01L 25/0655 (2013.01); H01L 25/50 (2013.01); H01P 3/08 (2013.01); H01Q 1/2283 (2013.01); H05K 1/0243 (2013.01); H01L 2223/6627 (2013.01); H05K 2201/10098 (2013.01)

(58) Field of Classification Search
CPC ........ H01L 25/0655; H01L 2223/6627; H01Q 1/2283
See application file for complete search history.

(56) References Cited

U.S. PATENT DOCUMENTS

2020/0203293 A1* 6/2020 Aygun .................... H01L 23/66

* cited by examiner

Primary Examiner — Tucker J Wright
(74) Attorney, Agent, or Firm — Essential Patents Group, LLP

(57) ABSTRACT

An electronic assembly, such as an integrated circuit package, may be formed comprising a package substrate, a plurality of integrated circuit devices electrically attached to the package substrate, wherein each integrated circuit device of the plurality of integrated circuit devices includes an active surface and a backside surface, and wherein a first integrated circuit device and a second integrated circuit device of the plurality of integrated circuit devices includes radio frequency logic circuitry and a radio frequency antenna formed in or attached thereto, and a radio frequency waveguide on the backside surface of the first integrated circuit device and on the backside surface of the second integrated circuit device.

20 Claims, 8 Drawing Sheets

RADIO FREQUENCY ANTENNAS AND WAVEGUIDES FOR COMMUNICATION BETWEEN INTEGRATED CIRCUIT DEVICES

TECHNICAL FIELD

Embodiments of the present description generally relate to the field of electronic assemblies and, more particularly, to the integration of radio frequency antennas and waveguides into electronic assemblies for communication between integrated circuit devices therein.

BACKGROUND

The integrated circuit industry is continually striving to produce ever faster and smaller integrated circuit devices for use in various server and mobile electronic products, including but not limited to, computer server products and portable products, such as wearable integrated circuit systems, portable computers, electronic tablets, cellular phones, digital cameras, and the like.

As these goals are achieved, the integrated circuit devices become smaller. However, communication demands have been increasing considerably faster than scaling (e.g. Moore's law) can achieve. For example, machine intelligence systems are requiring core counts in the thousands, "near compute" memory of greater than 10 gigabytes, connectivity bandwidth of greater than one terabyte per second between multiple nodes, low latency, thermal control, and good manufacturability, as will be understood to those skilled in the art. Of course, signal loss significantly increases with metal conductive routes as signaling frequency increases and distance between the integrated circuit device increases. Furthermore, the routing of the conductive routes becomes increasingly complex as more integrated circuit devices are added to an integrated circuit package. Attempts have been made to meet these issues through monolithic integration and/or wafer stacking; however, although such solutions may overcome some issues, additional innovations are still needed to overcome existing challenges with regard to latency, bandwidth density, and thermal control.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
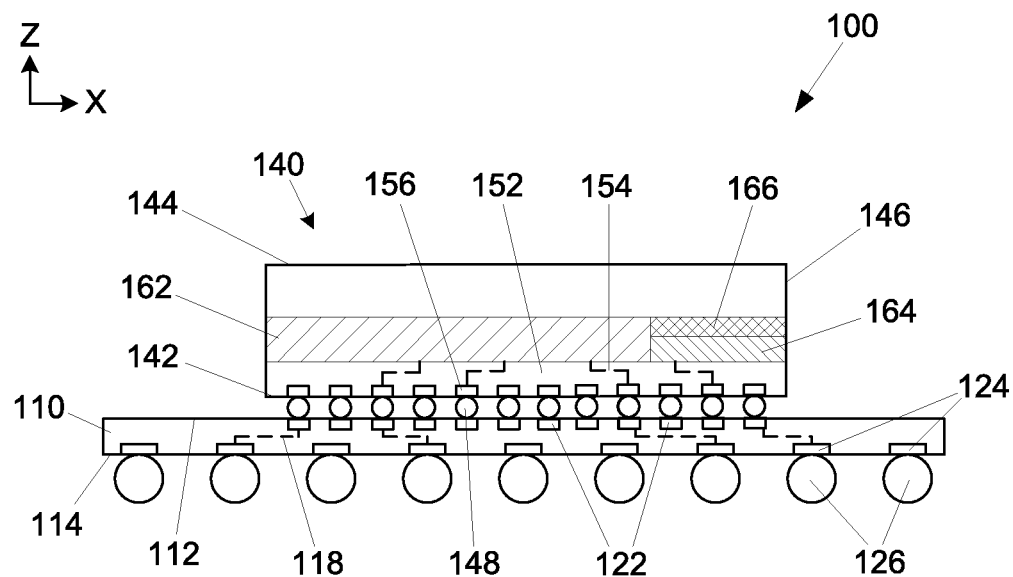
FIG. 1 is a side cross-sectional view of an electronic assembly having an integrated circuit device with radio frequency logic circuitry and a radio frequency antenna formed in a circuitry layer of the integrated circuit device, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to the formation of an electronic assembly, such as an integrated circuit package, comprising a package substrate, a plurality of integrated circuit devices electrically attached to the package substrate, wherein each integrated circuit device of the plurality of integrated circuit devices includes an active surface and a backside surface, and wherein a first integrated circuit device and a second integrated circuit device of the plurality of integrated circuit devices includes radio frequency logic circuitry and a radio frequency antenna formed in or attached thereto, and a radio frequency waveguide on the backside surface of the first integrated circuit device and on the backside surface of the second integrated circuit device.

FIG. 1 illustrates an electronic assembly 100, such as an integrated circuit package, having at least one integrated circuit device 140 electrically attached to a package substrate 110 in a configuration generally known as a flip-chip or controlled collapse chip connection ("C4") configuration, according to an embodiment of the present description.

The package substrate 110 may be any appropriate structure, including, but not limited to, an interposer. The package substrate 110 may have a first surface 112 and an opposing second surface 114. The package substrate 110 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, low temperature co-fired ceramic materials, and the like, as well as low-k and ultra low-k dielectrics (dielectric constants less than about 3.6), including, but not limited to, carbon doped dielectrics, fluorine doped dielectrics, porous dielectrics, organic polymeric dielectrics, fluoropolymers, and the like.

The package substrate 110 may further include conductive routes 118 or "metallization" (shown in dashed lines) extending through the package substrate 110. These conductive routes 118 may be a combination of conductive traces (not shown) formed between the dielectric material layers (not shown) and conductive vias (not shown) extending through the dielectric material layers (not shown). The structure and fabrication of conductive traces and conductive vias are well known in the art and are not shown or described for purposes of clarity and conciseness. The conductive traces and the conductive vias may be made of any appropriate conductive material, including but not limited to, metals, such as copper, silver, nickel, gold, and aluminum, alloys thereof, and the like. As will be understood to those skilled in the art, the package substrate 110 may be a cored substrate or a coreless substrate.

The integrated circuit device 140 may be any appropriate device, including, but not limited to, a microprocessor, a chipset, a graphics device, a wireless device, a memory device, an application specific integrated circuit, a transceiver device, an input/output device, combinations thereof, stacks thereof, or the like. As shown in FIG. 1, the integrated circuit device 140 may have an active surface 142, an opposing backside surface 144, and at least one side 146 extending between the active surface 142 and the backside surface 144.

The integrated circuit device 140 may include an interconnection layer 152 (also known as a "back end of line" or BEOL layer) at the active surface 142 thereof. The interconnection layer 152 may comprise a plurality of dielectric material layers (not shown) conductive routes 154 or "metallization" (shown in dashed lines) extending through the interconnection layer 152. As will be understood to those skilled in the art, the conductive routes 154 may be a combination of conductive traces (not shown) and conductive vias (not shown) extending through the plurality of dielectric material layers (not shown).

In an embodiment of the present description, the integrated circuit device 140 may be electrically attached to the package substrate 110 with a plurality of device-to-substrate interconnects 148. In one embodiment of the present description, the device-to-substrate interconnects 148 may extend between bond pads 122 on the first surface 112 of the package substrate 110 and bond pads 156 on the active surface 142 of the integrated circuit device 140.

The device-to-substrate interconnects 148 may be any appropriate electrically conductive material or structure, including, but not limited to, solder balls, metal bumps or pillars, metal filled epoxies, or a combination thereof. In one embodiment, the device-to-substrate interconnects 148 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device-to-substrate interconnects 148 may be copper bumps or pillars. In a further embodiment, the device-to-substrate interconnects 148 may be metal bumps or pillars coated with a solder material.

The bond pads 156 may be in electrical contact with the conductive routes 154, which may, in turn, be in electrical communication with integrated circuitry (not shown) within a circuitry layer 162 (also known as a "front end of line" or FEOL layer) of the integrated circuit device 140. The bond pads 122 on the first surface 112 of the package substrate 110 may be in electrical contact with the conductive routes 118. The conductive routes 118 may extend through the package substrate 110 and be connected to bond pads 124 on the second surface 114 of the package substrate 110. As will be understood to those skilled in the art, the package substrate 110 may reroute a fine pitch (center-to-center distance between the bond pads) of the integrated circuit device bond pads 156 to a relatively wider pitch of the bond pads 124 on the second surface 114 of the package substrate 110. In one embodiment of the present description, external interconnects 126 may be disposed on the bond pads 124 on the second surface 114 of the package substrate 110. The external interconnects 126 may be any appropriate electrically conductive material, including, but not limited to, metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). The external interconnects 126 may be used to attach the package assembly 100 to an external substrate (not shown), such as a motherboard.

As will be understood to those skilled in the art, the circuitry layer 162 may include the integrated circuitry (not shown), such as transistors, resistors, capacitors, and the like, formed in or on semiconductor material, such as silicon, germanium, and the like, from which the integrated circuit device 140 is formed. Within the circuitry layer 162, radio frequency logic circuitry 164 and a radio frequency antenna 166 may be formed, as shown in FIG. 1. The radio frequency logic circuitry 164 may include signal processing circuitry, including, but not limited to, filters, modulators, mixers, amplifiers, and the like. The structures, fabrication processes, materials, circuitry, and the like, for the fabrication of radio frequency logic circuitry 164 and radio frequency antennas 166 are well known in the art, and, for the purposes of clarity and conciseness, will not be shown or described in detail herein.

Figure 2:
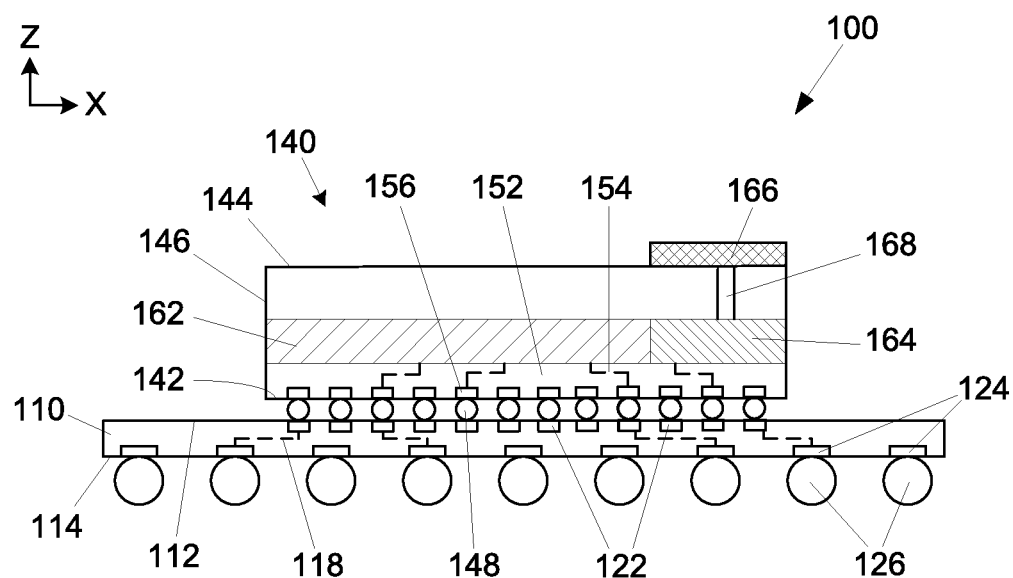
FIG. 2 is a side cross-sectional view of an electronic assembly having an integrated circuit device with radio frequency logic circuitry formed in a circuitry layer of the integrated circuit device and a radio frequency antenna attached to a backside surface of the integrated circuit device, according to another embodiment of the present description.

It is understood that, although having the radio frequency logic circuitry 164 and the radio frequency antenna 166 formed in the circuitry layer 162 during the formation of the integrated circuitry device 140, is efficient from a processing standpoint, having the radio frequency antenna 166 within the integrated circuit device 140 may be detrimental to signal transmission. Thus, as shown in FIG. 2, the radio frequency antenna 166 may be formed separately an attached to the backside surface 144 of the integrated circuit device 140 with at least one through silicon via 168 forming electrical communication between the radio frequency antenna 166 and the radio frequency logic circuitry 164.

Figure 3:
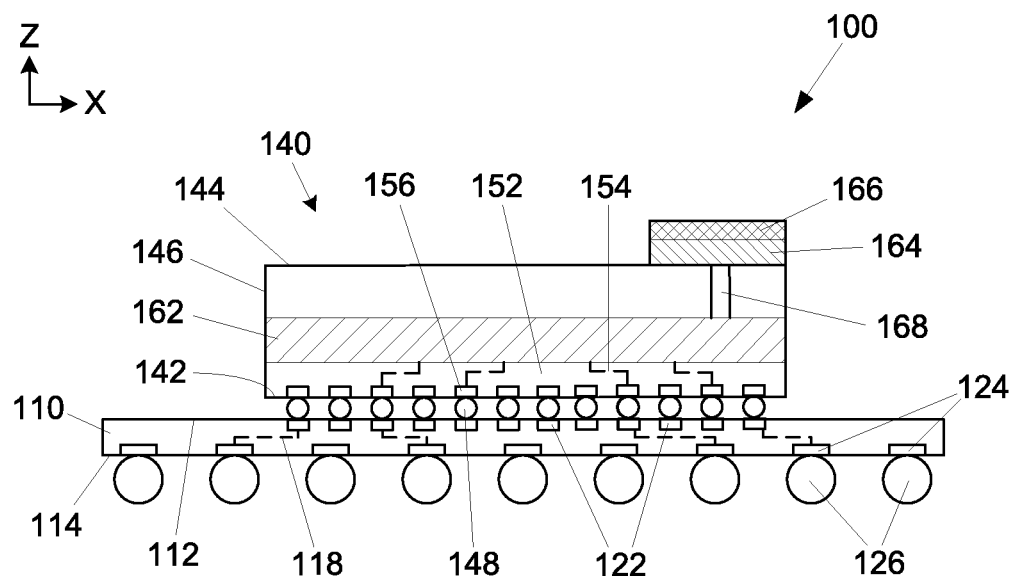
FIG. 3 is a side cross-sectional view of an electronic assembly having an integrated circuit device with radio frequency logic circuitry and a radio frequency antenna attached to a backside surface of the integrated circuit device, according to another embodiment of the present description.

In situations where the size/area within the circuitry layer 162 is a premium, both the radio frequency logic circuitry 164 and the radio frequency antenna 166 may be attached to the backside surface 144 of the integrated circuit device 140 with the at least one through silicon via 168 forming electrical communication between the radio frequency logic circuitry 164 and the integrated circuitry within the circuitry layer 162, as shown in FIG. 3. It is understood that the radio frequency logic circuitry 164 and the radio frequency antenna 166 may be positioned in any location to make the best use of space and/or to address any issues or concerns with regard to signal transmission.

Figure 4:
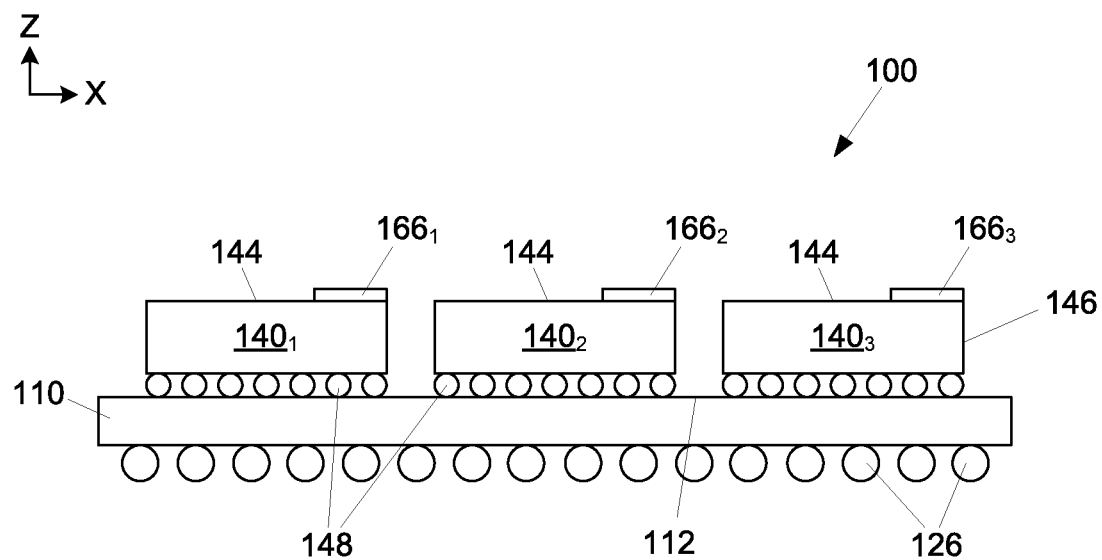
FIGS. 4 and 5 are a side cross-sectional view and an oblique view, respectively, of a plurality of integrated circuit devices attached to a package substrate, according to an embodiment of the present description.
Figure 5:
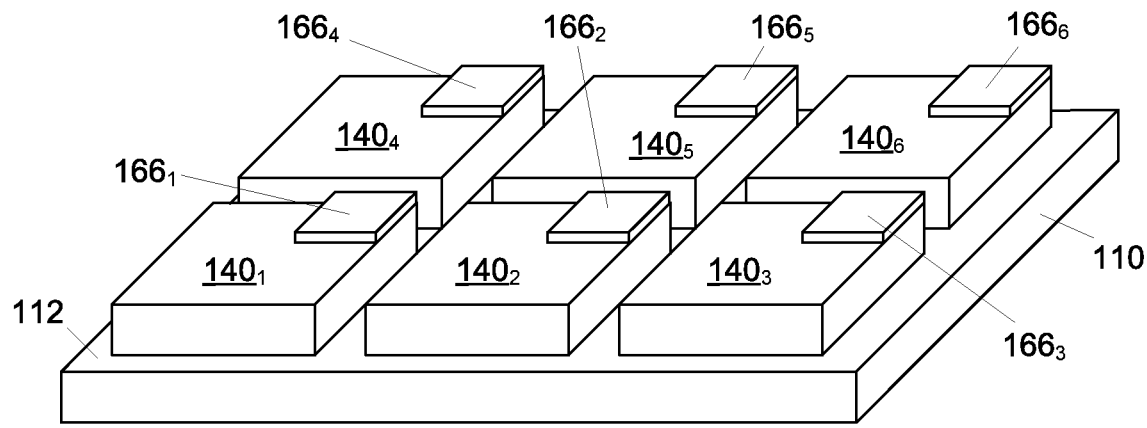

As shown in FIGS. 4 and 5, a plurality of integrated circuit devices (shown as elements $140_1$-$140_3$ in FIG. 4 and elements $104_1$-$140_6$ in FIG. 5), may be attached to the package substrate 110. The integrated circuit devices $140_1$-$140_6$ are illustrated as the embodiment of FIG. 2, but may be any embodiment of the present description.

Figure 6:
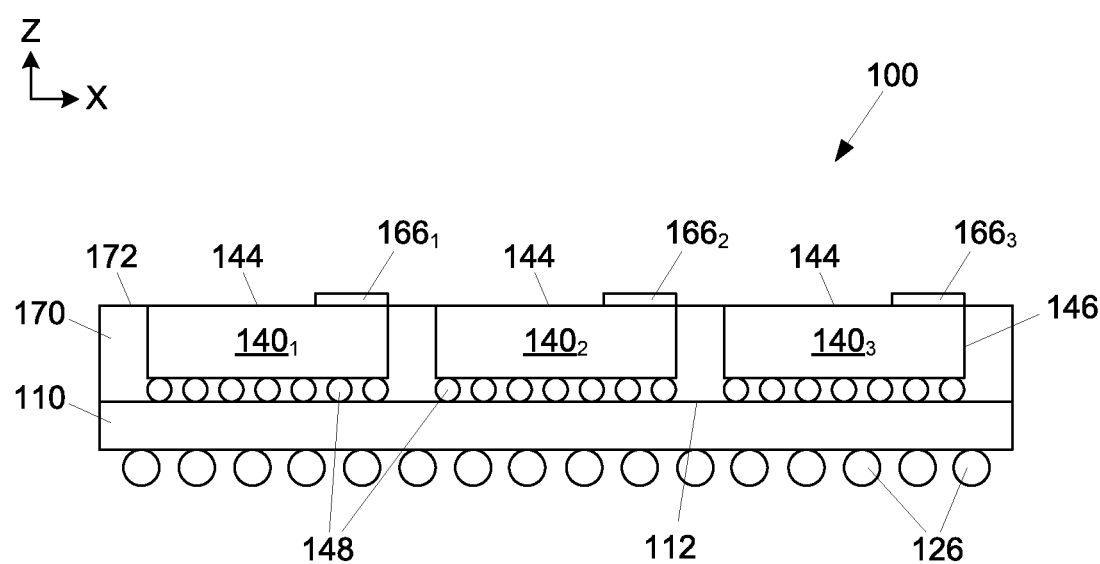
FIGS. 6 and 7 are a side cross-sectional view and an oblique view, respectively, of the plurality of integrated circuit devices of FIGS. 4 and 5, respectively, encapsulated in a mold material, according to an embodiment of the present description.
Figure 7:
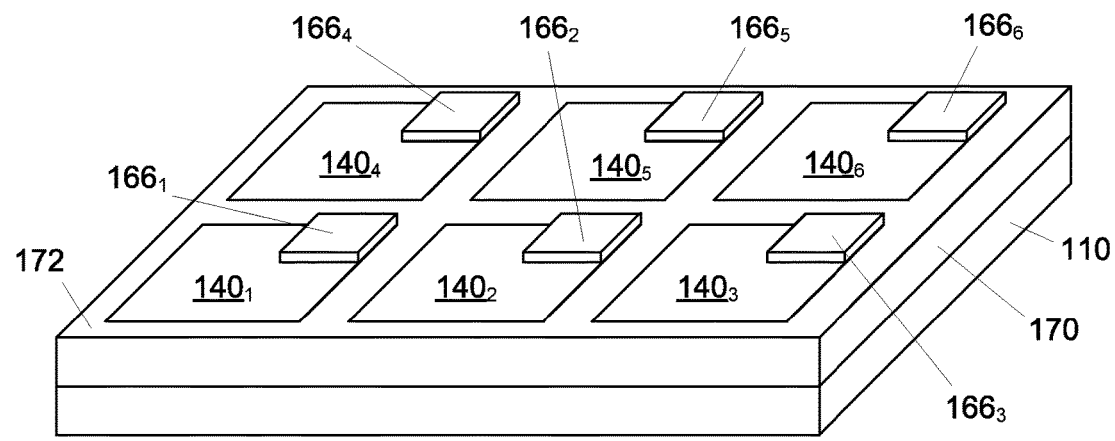

As shown in FIGS. 6 and 7, a mold material 170, such as an epoxy material, may be disposed over the first surface 112 for the package substrate 110 and may abut the sides 146 of the integrated circuit devices $140_1$-$140_6$. In one embodiment of the present description, an outer surface 172 of the mold material 170 may be substantially planar with the backside surfaces 144 of the integrated circuit devices $140_1$-$140_6$. The mold material 170 may be fabricated with any appropriate encapsulation and/or planarization processes, as known in the art.

Figure 8:
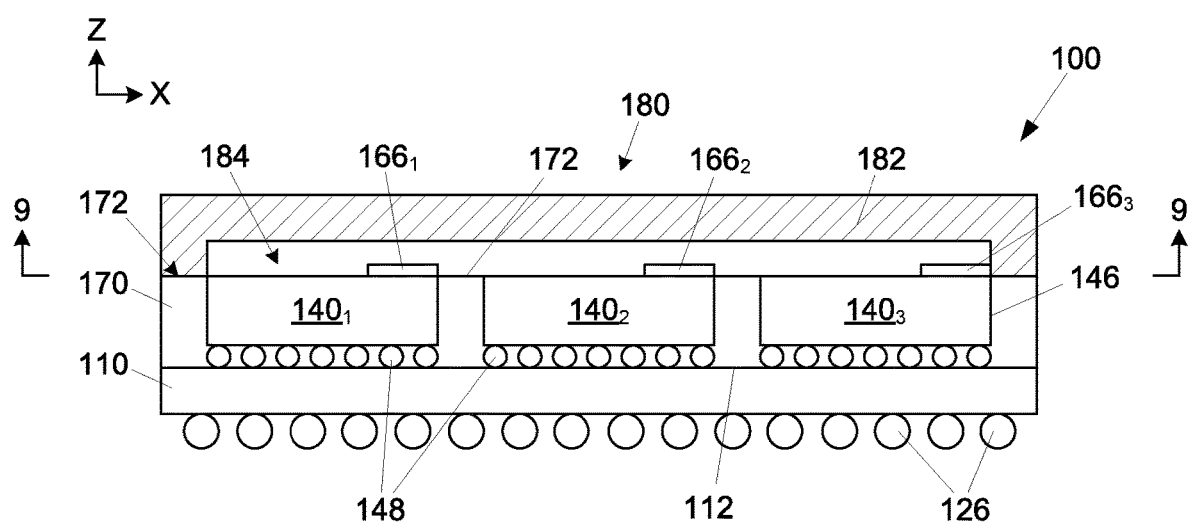
FIG. 8 is a side cross-sectional view of a radio frequency waveguide and an oblique view, respectively, of a plurality of integrated circuit devices attached to a package substrate, according to an embodiment of the present description.
Figure 9:
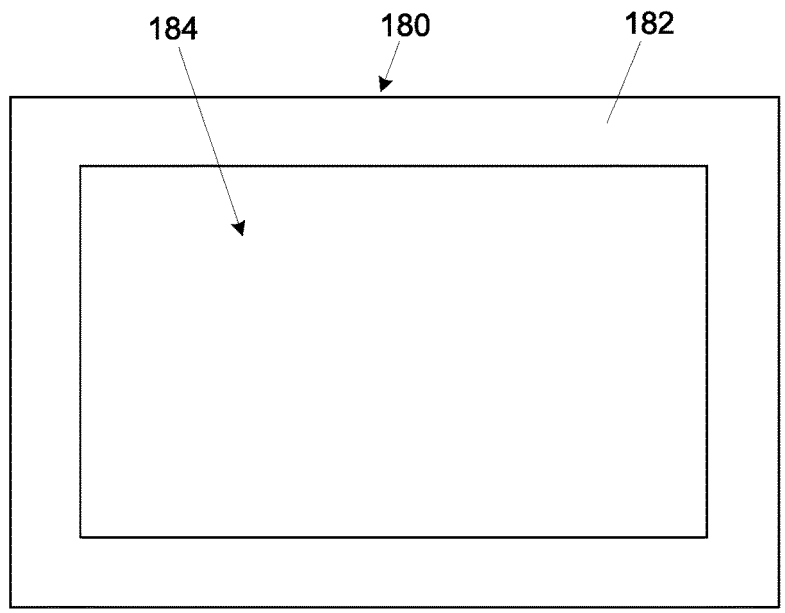
FIG. 9 is a plan view of a radio frequency waveguide along line 9-9 of FIG. 8, according to an embodiment of the present description.
Figure 10:
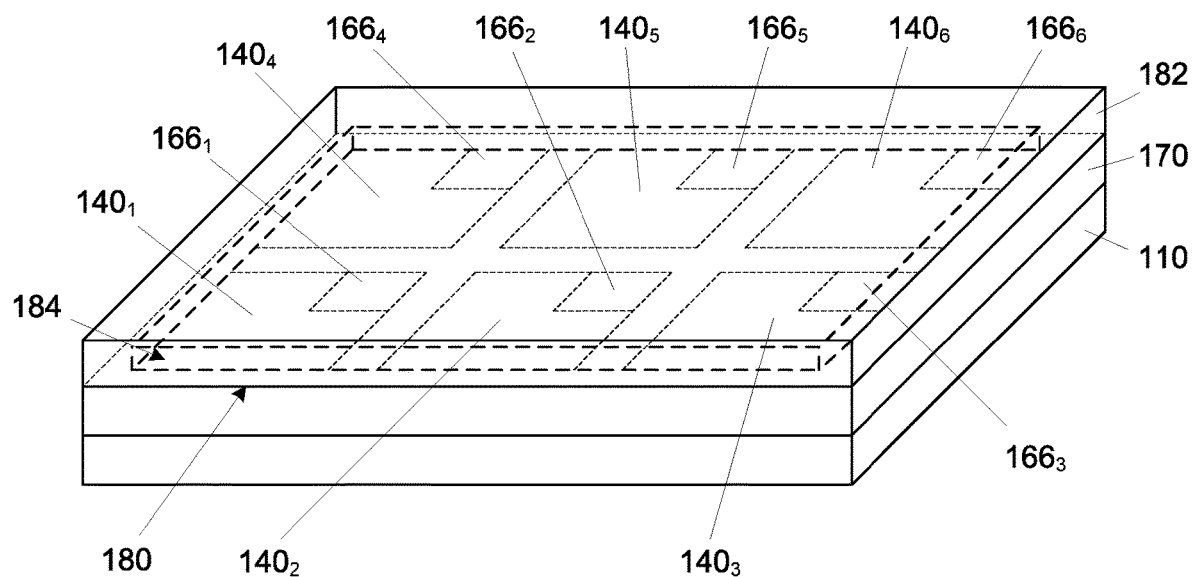
FIG. 10 is an oblique view of the electronic assembly of FIG. 8 having the radio frequency waveguide embodiment of FIG. 9, according to an embodiment of the present description.

As shown in FIG. 8, a waveguide 180 may be attached to the outer surface 172 of the mold material 170. The waveguide 180 may include a plate structure 182 and at least one recess 184 therein that extends between at least one pair of integrated circuit devices $140_1$-$140_6$ to guide signal transmission across multiple integrated circuit devices $140_1$-$140_6$. It is understood that the radio frequency antennas $166_1$-$166_6$ act as waveguide launchers. The waveguide 180 may be formed of any appropriate, substantially rigid material, including, but not limited to, metal, ceramics, plastics, and the like. In one embodiment of the present description, as shown in FIGS. 9 and 10, the recess 184 of the waveguide 180 may create a "picture frame" structure surrounding the integrated circuit devices $140_1$-$140_6$. It is understood that the recess 184 may be shaped to extend between discrete sets of radio frequency antennas $166_1$-$166_6$ and may have any appropriate shape or configuration. Furthermore, although the waveguide 180 is illustrated as a generic or signal material structure, it is understood that a variety of material and structures, such as cladding materials (not shown) and other waveguide enhancement materials and structures, may be incorporated into the waveguide 180. In a further embodiment of the present description, when thermal management is of a concern, the waveguide 180 may be fabricated of a thermally conductive material. In still further embodiments of the present description, the waveguide 180 may be a standard metal enclosure with air as an internal dielectric, a metal enclosure with a dielectric material disposed therein, or a metal enclosure with a thermal interface-like material disposed therein to mitigate heat issues.

Figure 11:
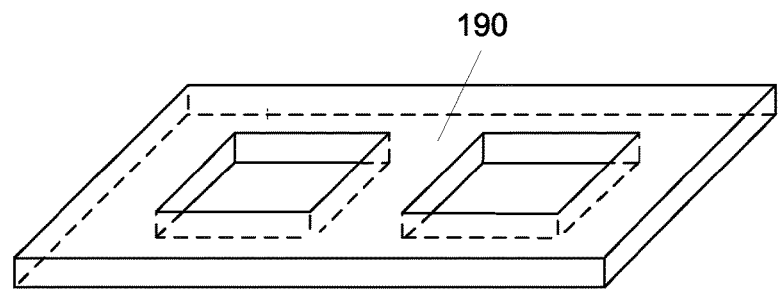
FIG. 11 is an oblique view of a radio frequency waveguide, according to an embodiment of the present description.
Figure 12:
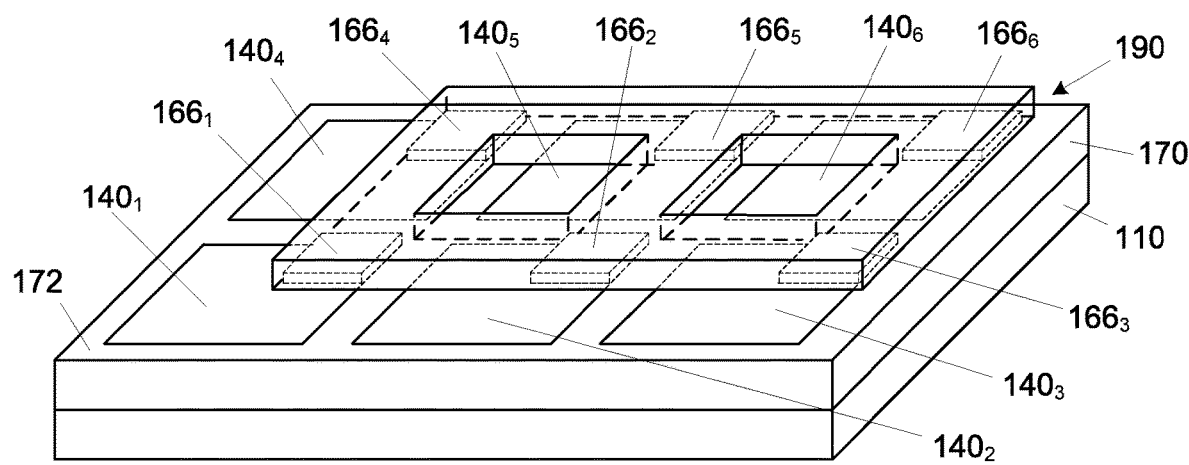
FIG. 12 is an oblique view of the electronic assembly of FIG. 7 having the radio frequency waveguide embodiment of FIG. 11 attached thereto, according to an embodiment of the present description.

In a further embodiment, shown in FIGS. 11 and 12, a waveguide 190 may be a pipe structure, as known in the art, which may be configured in a grid or mesh shape. As shown in FIG. 12, the waveguide 190 may provide minimal coverage over the integrated circuit devices $140_1$-$140_6$ to just capture all of the radio frequency antennas $166_1$-$166_6$.

As will be understood, the use of radio frequency logic circuitry, antennas, and waveguides of the embodiments of the present description can allow for the use of increased signal frequency, while reducing radio frequency signal loss by capturing and directing the radio frequency signals between multiple integrated circuit devices. Digital modulation schemes, such as "greater than 4-point quadrature amplitude modulation" (">QAM4") and "multiple access" (i.e. "Wavelength Division Multiple Access" and "Code Division Multiple Access"), can also be implemented to further increase data transfer rate/bandwidth and allow for multiple integrated circuit devices to communicate across the same radio frequency waveguides.

Figure 13:
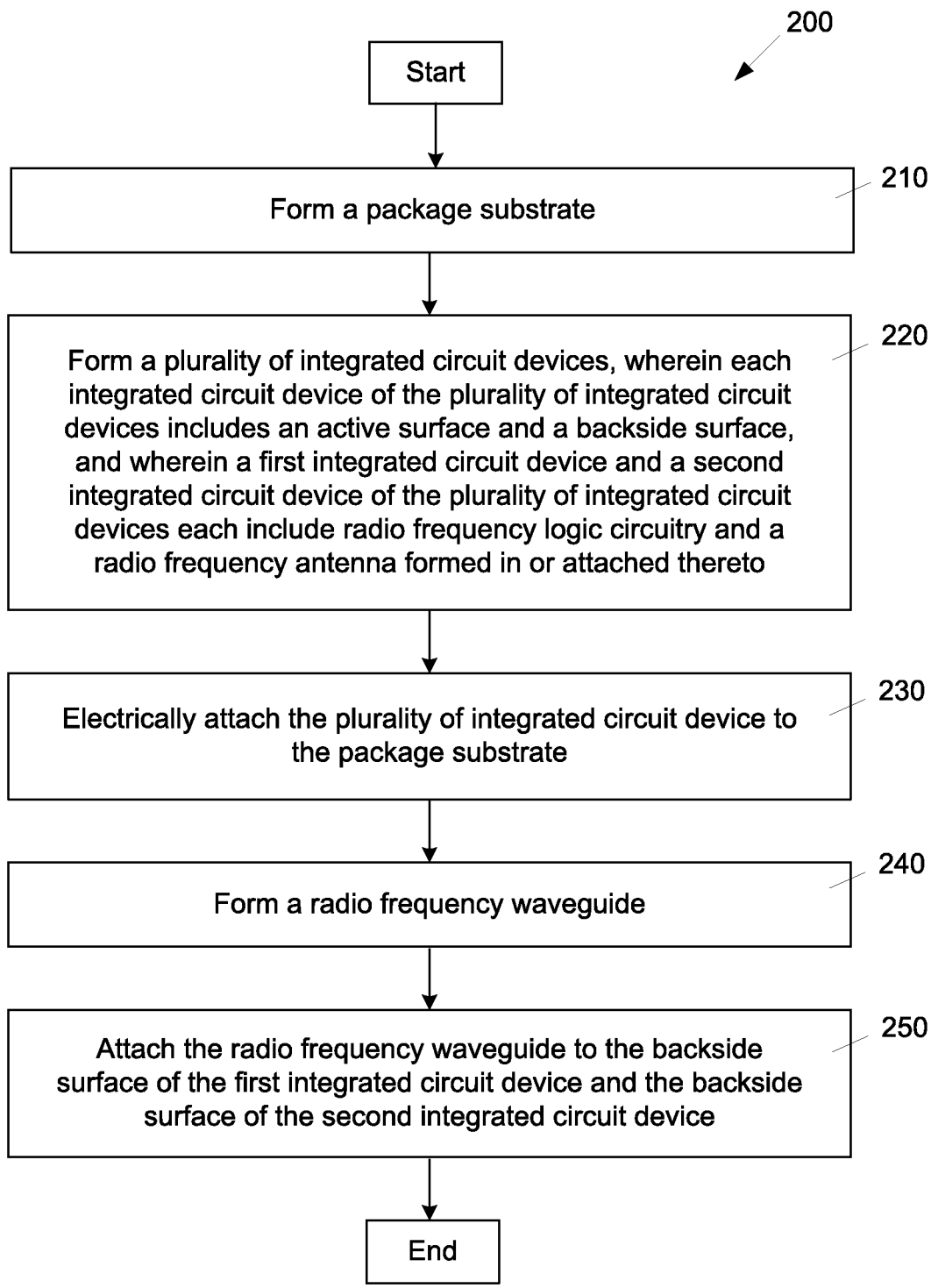
FIG. 13 is a flow chart of a process of fabricating an electronic assembly, according to an embodiment of the present description.

FIG. 13 is a flow chart of a process 200 of fabricating an electronic package according to an embodiment of the present description. As set forth in block 210, a package substrate may be formed. A plurality of integrated circuit devices may be formed, wherein each integrated circuit device of the plurality of integrated circuit devices includes an active surface and a backside surface, and wherein a first integrated circuit device and a second integrated circuit device of the plurality of integrated circuit devices each include radio frequency logic circuitry and a radio frequency antenna formed in or attached thereto, as set forth in block 220. As set forth in block 230, the plurality of integrated circuit devices may be electrically attached to the package substrate. A radio frequency waveguide may be formed, as set forth in block 240. As set forth in block 250, the radio frequency waveguide may be attached to the backside surface of the first integrated circuit device and the backside surface of the second integrated circuit device.

Figure 14:
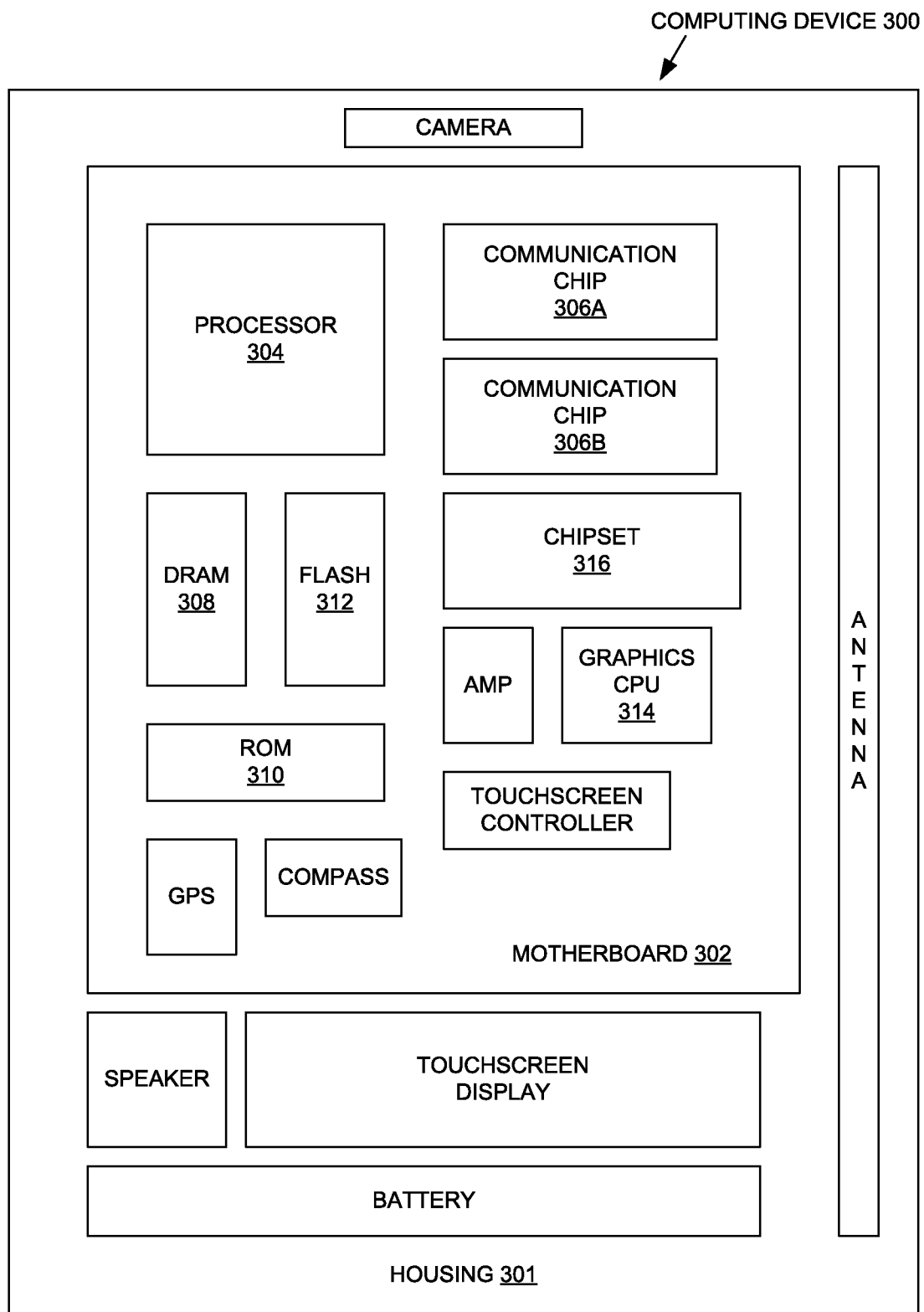
FIG. 14 is an electronic system, according to one embodiment of the present description.

FIG. 14 illustrates an electronic or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit package, which comprises a package substrate; a plurality of integrated circuit devices electrically attached to the package substrate, wherein each integrated circuit device of the plurality of integrated circuit devices includes an active surface and a backside surface, and wherein a first integrated circuit device and a second integrated circuit device of the plurality of integrated circuit devices include radio frequency logic circuitry and a radio frequency antenna formed in or attached thereto; and a radio frequency waveguide on the backside surface of the first integrated circuit device and the second integrated circuit device.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-14. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an integrated circuit package, comprising a package substrate; a plurality of integrated circuit devices electrically attached to the package substrate, wherein each integrated circuit device of the plurality of integrated circuit devices includes an active surface and a backside surface, and wherein a first integrated circuit device and a second integrated circuit device of the plurality of integrated circuit devices include radio frequency logic circuitry and a radio frequency antenna formed in or attached thereto; and a radio frequency waveguide on the backside surface of the first integrated circuit device and the backside surface of the second integrated circuit device.

In Example 2, the subject matter of Example 1 can optionally include the radio frequency waveguide comprising a plate structure having a recess therein.

In Example 3, the subject matter of Example 2 can optionally include the plate structure extending over each integrated circuit device of the plurality of integrated circuit devices.

In Example 4, the subject matter of Examples 1 can optionally include the radio frequency waveguide comprising a pipe structure extending between the first integrated circuit device and the second integrated circuit device.

In Example 5, the subject matter of any of Examples 1 to 4 can optionally include the radio frequency waveguide being thermally conductive.

In Example 6, the subject matter of any of Examples 1 to 5 can optionally include at least one integrated circuit device of the plurality of circuit devices including a circuitry layer proximate the first surface of the at least one integrated circuit device and wherein the radio frequency logic circuitry and the radio frequency antenna are in the circuitry layer.

In Example 7, the subject matter of any of Examples 1 to 5 can optionally include at least one integrated circuit device of the plurality of circuit devices comprising a circuitry layer proximate the active surface of the at least one integrated circuit device and wherein the radio frequency logic circuitry is in the circuitry layer and the radio frequency antenna is on the backside surface of the at least one integrated circuit device.

In Example 8, the subject matter of any of Examples 1 to 5 can optionally include the radio frequency logic circuitry and the radio frequency antenna being on the backside surface of the at least one integrated circuit device of the plurality of integrated circuit devices.

Example 9 is an electronic system, comprising an electronic board and an integrated circuit package electrically attached to the electronic board, wherein the integrated circuit package comprises a package substrate; a plurality of integrated circuit devices electrically attached to the package substrate, wherein each integrated circuit device of the plurality of integrated circuit devices includes an active surface and a backside surface, and wherein a first integrated circuit device and a second integrated circuit device of the plurality of integrated circuit devices include radio frequency logic circuitry and a radio frequency antenna formed in or attached thereto; and a radio frequency waveguide on the backside surface of the first integrated circuit device and the backside surface of the second integrated circuit device.

In Example 10, the subject matter of Example 9 can optionally include the radio frequency waveguide comprising a plate structure having a recess therein.

In Example 11, the subject matter of Example 10 can optionally include the plate structure extending over each integrated circuit device of the plurality of integrated circuit devices.

In Example 12, the subject matter of Examples 9 can optionally include the radio frequency waveguide comprising a pipe structure extending between the first integrated circuit device and the second integrated circuit device.

In Example 13, the subject matter of any of Examples 9 to 12 can optionally include the radio frequency waveguide being thermally conductive.

In Example 14, the subject matter of any of Examples 9 to 13 can optionally include at least one integrated circuit device of the plurality of circuit devices including a circuitry layer proximate the first surface of the at least one integrated circuit device and wherein the radio frequency logic circuitry and the radio frequency antenna are in the circuitry layer.

In Example 15, the subject matter of any of Examples 9 to 13 can optionally include at least one integrated circuit device of the plurality of circuit devices comprising a circuitry layer proximate the active surface of the at least one integrated circuit device and wherein the radio frequency logic circuitry is in the circuitry layer and the radio frequency antenna is on the backside surface of the at least one integrated circuit device.

In Example 16, the subject matter of any of Examples 9 to 13 can optionally include the radio frequency logic circuitry and the radio frequency antenna being on the backside surface of the at least one integrated circuit device of the plurality of integrated circuit devices.

Example 17 is a method of fabricating an integrated circuit package, comprising forming a package substrate; forming a plurality of integrated circuit devices, wherein each integrated circuit device of the plurality of integrated circuit devices includes an active surface and a backside surface, and wherein a first integrated circuit device and a second integrated circuit device of the plurality of integrated circuit devices include radio frequency logic circuitry and a radio frequency antenna formed in or attached thereto; electrically attaching the plurality of integrated circuit devices to the package substrate; forming a radio frequency waveguide; and attaching the radio frequency waveguide to the backside surface of the first integrated circuit device and the backside surface of the second integrated circuit device.

In Example 18, the subject matter of Example 17 can optionally include forming the radio frequency waveguide comprising forming a plate structure and forming a recess in the plate structure.

In Example 19, the subject matter of Example 18 can optionally include the plate structure extending over each integrated circuit device of the plurality of integrated circuit devices.

In Example 20, the subject matter of Examples 17 can optionally include forming the radio frequency waveguide comprising forming a pipe structure and wherein attaching the radio frequency waveguide comprising extending between the pipe structure between the first integrated circuit device and the second integrated circuit device.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit package, comprising:
   a package substrate;
   a plurality of integrated circuit devices electrically attached to the package substrate, wherein each integrated circuit device of the plurality of integrated circuit devices includes an active surface facing the package substrate and a backside surface opposite the active surface, and wherein a first integrated circuit device and a second integrated circuit device of the plurality of integrated circuit devices include radio frequency logic circuitry and a radio frequency antenna in the integrated circuit device or attached thereto; and
   a radio frequency waveguide over the backside surface of the first integrated circuit device and over the backside surface of the second integrated circuit device.

2. The integrated circuit package of claim 1, wherein the radio frequency waveguide comprises a plate structure having a recess therein, the recess spanning the radio frequency antenna of both the first and second integrated circuit devices.

3. The integrated circuit package of claim 2, wherein the plate structure extends over each integrated circuit device of the plurality of integrated circuit devices and wherein the plate structure is coupled to an epoxy material over a periphery of the package substrate.

4. The integrated circuit package of claim 3, wherein the first and second integrated circuit devices are in the epoxy material and at least a portion of the backside surface comprising the radio frequency antenna is free of the epoxy material.

5. The integrated circuit package of claim 1, wherein the radio frequency waveguide comprises a pipe structure spanning the radio frequency antenna of both the first and second integrated circuit devices.

6. The integrated circuit package of claim 1, wherein the radio frequency waveguide comprises a metal enclosure spaced apart from each radio frequency antenna by an air gap.

7. The integrated circuit package of claim 1, wherein at least one integrated circuit device of the plurality of integrated circuit devices includes a circuitry layer proximate the active surface of the at least one integrated circuit device and wherein the radio frequency logic circuitry and the radio frequency antenna are in the circuitry layer.

8. The integrated circuit package of claim 1, wherein at least one integrated circuit device of the plurality of integrated circuit devices comprises a circuitry layer proximate the active surface of the at least one integrated circuit device and wherein the radio frequency logic circuitry is in the circuitry layer and the radio frequency antenna is on the backside surface of the at least one integrated circuit device.

9. The integrated circuit package of claim 1, wherein the radio frequency logic circuitry and the radio frequency antenna are on the backside surface of the first and second integrated circuit devices.

10. The integrated circuit package of claim 1, wherein the plurality of integrated circuit devices are in a two-dimensional array spaced over the package substrate and wherein the radio frequency waveguide comprises a metal lid enclosing a single volume spanning the two-dimensional array.

11. The integrated circuit package of claim 1, wherein the plurality of integrated circuit devices are in a two-dimensional array spaced over the package substrate and wherein the radio frequency waveguide comprises a grid of pipes spanning the array and intersecting the radio frequency antennas of each of the integrated circuit devices.

12. An electronic system, comprising:
    an electronic board; and
    an integrated circuit package electrically attached to the electronic board, wherein the integrated circuit package comprises:
    a package substrate;
    a plurality of integrated circuit devices electrically attached to the package substrate and within an epoxy material, wherein each integrated circuit device of the plurality of integrated circuit devices includes an active surface facing the package substrate and a backside surface opposite the active surface, and wherein a first integrated circuit device and a second integrated circuit device of the plurality of integrated circuit devices include radio frequency logic circuitry and a radio frequency antenna in the integrated circuit device or attached thereto; and a radio frequency waveguide over the backside surface of the first integrated circuit device and over the backside surface of the second integrated circuit device, the radio frequency waveguide coupled to the epoxy material.

13. The electronic system of claim 12, wherein the radio frequency waveguide comprises a plate structure having a recess therein, the plate structure enclosing the radio frequency antenna of the first and second integrated circuit devices and the recess spacing the plate structure apart from the radio frequency antenna of the first and second integrated circuit devices.

14. The electronic system of claim 13, wherein the plate structure extends over each integrated circuit device of the plurality of integrated circuit devices and wherein the plate structure is coupled to the epoxy material over a periphery of the package substrate.

15. The electronic system of claim 12, wherein the radio frequency waveguide comprises a pipe structure spanning the radio frequency antenna of both the first and second integrated circuit devices.

16. The electronic system of claim 12, wherein the radio frequency waveguide comprises a metal enclosure spaced apart from each radio frequency antenna by an air gap.

17. The electronic system of claim 12, wherein at least one integrated circuit device of the plurality of integrated circuit devices includes a circuitry layer proximate the active surface of the at least one integrated circuit device and wherein the radio frequency logic circuitry and the radio frequency antenna are in the circuitry layer.

18. The electronic system of claim 12, wherein at least one integrated circuit device of the plurality of integrated circuit devices comprises a circuitry layer proximate the active surface of the at least one integrated circuit device and wherein the radio frequency logic circuitry is in the circuitry layer and the radio frequency antenna is on the backside surface of the at least one integrated circuit device.

19. The electronic system of claim 12, wherein the radio frequency logic circuitry and the radio frequency antenna are on the backside surface of the first and second integrated circuit devices.

20. The electronic system of claim 12, wherein at least a portion of the backside surface comprising the radio frequency antenna is free of the epoxy material.

* * * * *